(12) United States Patent
Ottobon et al.

(10) Patent No.: US 9,165,236 B2
(45) Date of Patent: Oct. 20, 2015

(54) METHOD FOR MANUFACTURING SMART CARDS

(71) Applicants: Stephane Ottobon, Meudon (FR);
Lucile Dossetto, Meudon (FR)

(72) Inventors: Stephane Ottobon, Meudon (FR);
Lucile Dossetto, Meudon (FR)

(73) Assignee: GEMALTO SA, Muedon (FR)

( * ) Notice: Subject to any disclaimer, the term of this patent is extended or adjusted under 35 U.S.C. 154(b) by 0 days.

(21) Appl. No.: 14/365,281

(22) PCT Filed: Dec. 7, 2012

(86) PCT No.: PCT/EP2012/074852
§ 371 (c)(1),
(2) Date: Jun. 13, 2014

(87) PCT Pub. No.: WO2013/087541
PCT Pub. Date: Jun. 20, 2013

(65) Prior Publication Data
US 2014/0367473 A1  Dec. 18, 2014

(30) Foreign Application Priority Data
Dec. 14, 2011  (EP) .................................. 11306663

(51) Int. Cl.
| | |
|---|---|
| *G06K 7/08* | (2006.01) |
| *G06K 19/02* | (2006.01) |
| *G06K 19/06* | (2006.01) |
| *G06K 19/077* | (2006.01) |
| *H01L 21/56* | (2006.01) |

(52) U.S. Cl.
CPC ........ *G06K 19/07728* (2013.01); *G06K 19/077* (2013.01); *G06K 19/07722* (2013.01); *G06K 19/07743* (2013.01); *G06K 19/07745* (2013.01); *H01L 21/56* (2013.01); *H01L 2224/48228* (2013.01); *H01L 2924/19107* (2013.01)

(58) Field of Classification Search
USPC .......................................... 235/451, 488, 492
See application file for complete search history.

(56) References Cited

U.S. PATENT DOCUMENTS 8,608,080 B2 *  12/2013  Finn .............................. 235/492
2006/0043609 A1 *  3/2006  Brennan et al. ............... 257/784
(Continued)

FOREIGN PATENT DOCUMENTS

| EP | 1515269 A2 | 3/2005 |
| EP | 2221752 A1 | 8/2010 |
| FR | 2870968 A1 | 12/2005 |

OTHER PUBLICATIONS

PCT/EP2012/074852 International Search Report, Mar. 12, 2013, European Patent Office, P.B. 5818 Patentlaan 2, NL—2280 HV Rijswijk.

*Primary Examiner* — Tuyen K Vo
(74) *Attorney, Agent, or Firm* — The Jansson Firm; Pehr B. Jansson

(57) ABSTRACT

This invention relates to a smart card (1) manufacturing method that makes it possible to reduce the thickness of the said smart card and directly obtain a final 3FF or 4FF format. The smart card manufacturing method comprises steps for depositing resin forming a first protective coat (11) over the electronic element assembly with a surface greater than the required smart card format and depositing a second protective coat with a format larger than the required card format on the first protective coat. The second protective coat is fixed to the first protective coat by curing the first protective coat, and then the assembly obtained in that way is cut to the required format.

9 Claims, 4 Drawing Sheets

(56) References Cited

U.S. PATENT DOCUMENTS

| | | |
|---|---|---|
| 2006/0205280 A1 | 9/2006 | Nishizawa et al. |
| 2008/0283615 A1* | 11/2008 | Finn .............................. 235/488 |
| 2009/0095415 A1* | 4/2009 | Halope et al. ................. 156/277 |
| 2011/0024036 A1* | 2/2011 | Benato .......................... 156/277 |

\* cited by examiner

METHOD FOR MANUFACTURING SMART CARDS

BACKGROUND

This invention relates to a method for manufacturing smart cards in the UICC (Universal Integrated Circuit Card) 2FF, 3FF or 4FF formats. The smart cards may for example be SIM cards.

The embedding method is generally used while manufacturing SIM cards. The first stage of this process consists in encapsulating an electronic component assembly comprising an integrated circuit and connecting wires into resin in order to protect the components of the electronic module. That encapsulated assembly is then glued into a cavity of a package, which may be made of plastic, for example. The package is often called the "card body".

With the miniaturisation and the increase in the functions of mobile telephones, the format of SIM cards is ever smaller, and so is their thickness. The change from the 2FF form factor (25×15 mm2) to 3FF format (15×12 mm2) and soon to 4FF format reduces the gluing surface and the size of the components that can be integrated into the module.

Further, the reduction in the thickness of SIM cards is being studied, in order to reduce the volume of SIM cards in their readers and also to allow the insertion of small SIM cards into adapters that enable compatibility with the connectors of readers using older formats.

One drawback of the standard embedding method is that it does not make it possible to easily reduce the thickness of SIM cards below the current thickness of 0.80 mm. In that method, the resin that encapsulates the electronic component assembly can have surface irregularities and topology with height differences that are too large to be delivered to customers as a finished product. Besides, that surface relief does not comply with the thickness tolerances of mini cards or other integrated circuit packages.

To remedy that problem of surface irregularities, the standard method consists in inserting the encapsulated electronics component assembly—called the module—into a card body. However, that solution increases the thickness of the smart card. That is because it results in a stack including the hot melt adhesive that glues the electronic module to the card body, the gap between the module and the bottom of the card cavity and the thickness of the bottom of the card cavity. That stack represents at least 0.15 mm, thus limiting the possibility of reducing the thickness.

An additional drawback is that the card body manufactured according to the applicable ISO standard has an extended format in relation to the final format of the SIM card, regardless of that final format. As a result, the useful surface of the smart card, that is to say the surface available for the electronics components, limited. The card body is scored around the SIM card, and the user separates the two before using the SIM card. That is why embedding makes it necessary to use a large quantity of plastic, which increases the cost of the method.

The document WO 2010/094782 A1 discloses a method for manufacturing smart cards without resorting to embedding. The electronic module is covered with a coat of resin with dimensions that are slightly larger than those of the final format of the smart card. That coat of resin makes up the smart card package in itself.

One drawback is that the resin is dispensed using the Resin Transfer Moulding (or RTM) method, which requires costly investment in specialised equipment.

The document EP 0644507 B1 discloses a method for manufacturing smart cards without resorting to embedding. In that method, the electronic module comprises a cover platelet coated with resin on one side. The coated platelet is placed on the electronic module so that the resin covers the electronic module. The method makes it possible to reduce the final thickness of the module to 0.62 mm but it is still necessary to embed the module and thus have an additional thickness of plastic that is added to the thickness of the module.

Another drawback is that it requires specific equipment, which leads to an increase in costs.

SUMMARY

One of the aims of this invention is to remedy, at least partially, the drawbacks of the prior art and offer a SIM card manufacturing method that allows a significant reduction in thickness without investing in costly equipment.

This invention consists in a smart card manufacturing method comprising a dielectric carrier film, with on one side, at least one electrical contact zone and, on a second side opposite the first one, a group of electronic elements comprising at least one electronic chip and connecting wires, the electronic chip being connected to the said at least one electrical contact zone by the connecting wires going through a first set of openings in the dielectric carrier film, characterised in that the said method comprises the following steps:

on the second side of the dielectric carrier film, protective resin is applied that forms a first protective coat with thickness that is at least equal to the maximum extension of the said group of electronic elements in a direction perpendicular to the plane defined by the said dielectric carrier film, with an area along the plane of the dielectric carrier film that is greater than the required format of the smart card, on the first protective coat, a second protective coat is applied at least on the electronic chip, with an area along the plane of the dielectric carrier film that is greater than the required format of the smart card, the second protective coat is fixed to the first protective coat by curing the first protective coat.

the assembly obtained in that way is cut to the required format.

In one aspect of the invention, the second protective coat is made in the form of an individual pad with a format that is slightly greater than the final format of the smart card.

In another aspect of the invention, the second protective coat is made in the form of a film extending over the whole dielectric carrier comprising a plurality of electronic modules.

In another aspect of the invention, before the first protective coat is applied, props of the same size are fixed on the electrical contact zone through the first set of openings in the dielectric carrier film in a direction perpendicular to the plane defined by the dielectric carrier film.

In another aspect of the invention, the first protective coat is applied in a thickness at least equal to the maximum extension of the props in the direction perpendicular to the plane defined by the dielectric carrier film.

In another aspect of the invention, the second protective coat is made of epoxy glass or plastic or thermostable material.

In another aspect of the invention, the graphics on the second protective coat are personalised before the coat is deposited on the first protective coat.

This invention also consists in a smart card comprising a dielectric carrier film, with on one side, at least one electrical contact zone and, on a second side opposite the first one, a useful surface on which is placed an electronic component assembly comprising at least one electronic chip and connecting wires, the electronic chip being connected to the said at least one electrical contact zone by the connecting wires going through a set of openings in the dielectric carrier film, characterised in that:

it comprises a first protective coat on the second side of the dielectric carrier film, with thickness at least equal to the maximum height of the maximum height of the electronic component assembly, it comprises a second protective coat on the first protective coat, the useful surface extends over the whole surface of the smart card.

In one aspect of the invention, the smart card has props with height at least equal to that of the highest component of the electronic component assembly on which the second protective coat is applied.

BRIEF DESCRIPTION OF THE DRAWINGS

Other characteristics and benefits will become clearer in the description below and the figures accompanying it, where.

The same elements have the same reference in the different figures.

DETAILED DESCRIPTION

Figure 1:
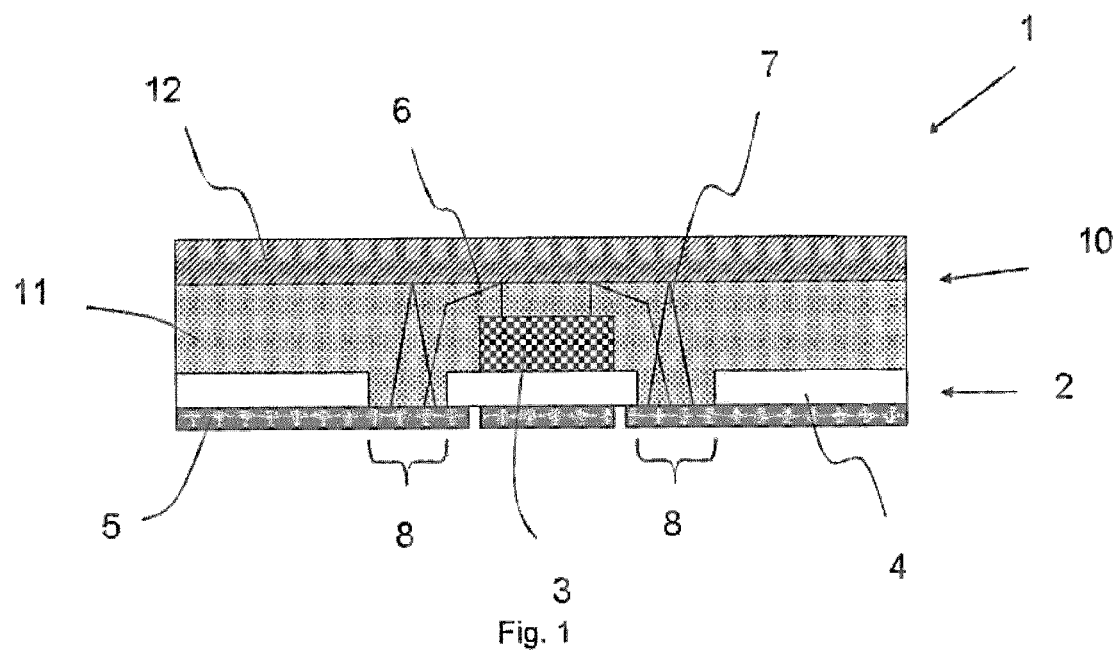
FIG. 1 is a schematic representation of a transverse section of a smart card according to this invention.

FIG. 1 represents the final format of the smart card 1 in a sectional view. The said smart card is made up of two assemblies: firstly an electronic component assembly 2 and secondly a package 10. The said electronic component assembly 2 comprises a dielectric carrier film 4 with at least one electrical contact zone 5 on a first side, and an electronic chip 3 fixed to a second side opposite the first one. The electronic chip 3 is connected to the electrical contact zone by connecting wires 6 going through openings 8 in the dielectric carrier film 4. The assembly of the electronic component assembly on the dielectric carrier film follows a method that is well known to the electronic data media industry and is not covered by this patent.

The package 10 comprises props 7, a first protective coat 11 and a second protective coat 12. The props 7 are metal wires of the same size and height that is greater than that of the chip 3 and at least equal to that of the connecting wires 6. The props 7 may for example be soldered to the electrical contact zone 5 through the openings 8 that also allow the passage of the connecting wires 6.

The first protective coat 11 is located on the second side of the dielectric carrier film 4 and covers the electronic chip 3, the connecting wires 6 and the props 7. The said first protective coat 11 is made of resin, for example of the epoxy type.

The second protective coat 12 is located on the first protective coat 11. The said second protective coat 12 may be made of epoxy glass or thermoplastic or thermostable material (PET, PEN) or thermosetting material. The dimensions of the smart card are small, so the tolerance margins are stricter. The said second protective coat makes it possible to achieve mechanical and thermo-mechanical reliability that is greater than that of resin applied alone, and thus better comply with the tolerances imposed. Further, in relation to the said first protective coat, the surface of the said second protective coat is much more even and regular, making it possible to comply with the thickness tolerances of 3FF or 4FF smart card formats.

The total thickness of the smart card 1 is thus the thickness of the first protective coat 11 added to the thickness of the second protective coat 12, the thickness of the dielectric carrier film 4 and the thickness of the electrical contact zone 5.

Figure 2:
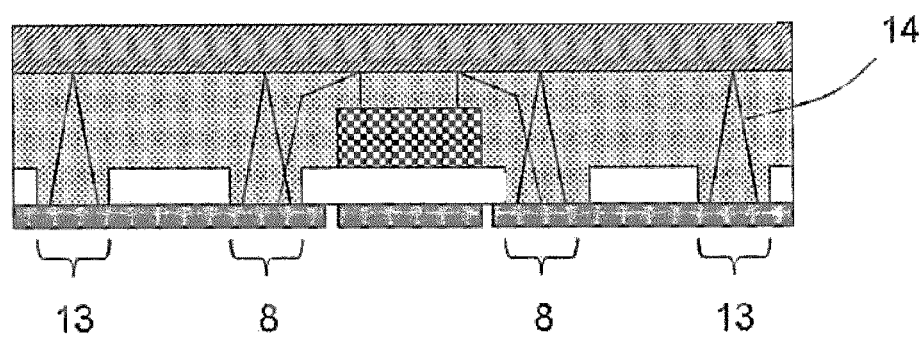
FIG. 2 is a schematic representation of a transverse section of an alternative of the smart card according to this invention.

FIG. 2 illustrates an alternative of the invention. In that alternative, there is a second set of openings 13 through the dielectric carrier film 4, up to the electrical contact zone 5. These openings are not used to establish electrical connection between the electronic chip 3 and the electrical contact zone 5. Additional props 14 may be soldered to the electrical contact zone 5 through the second set of openings 13. Their size is equal to that of the props 7 soldered through the first set of openings 8. The purpose of these additional props is to improve the coplanarity of the smart card.

Figure 3:
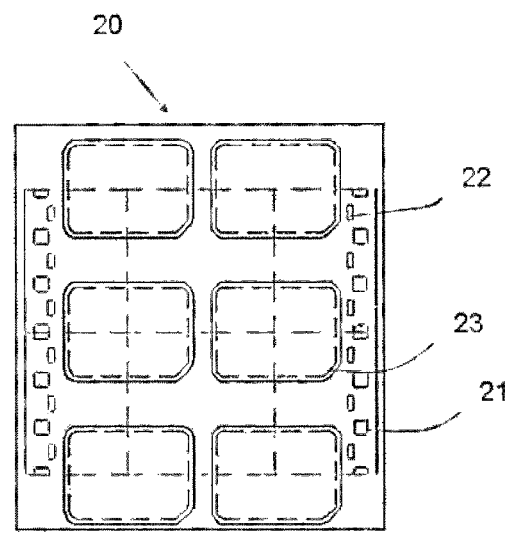
FIG. 3 is a top view of the carrier film of the electronic data media before cutting.

FIG. 3 is a top view of the flexible carrier film 20 on which the smart cards 1 are located before they are cut. The flexible carrier film comprises indexing holes 21 for assembly, and for cutting reference. The final format 23 of the smart card 1 is slightly smaller than the format 22 of the second protective coat 12. The cut is made along the 2FF, 3FF or 4FF format of the smart card 1.

Figure 4:
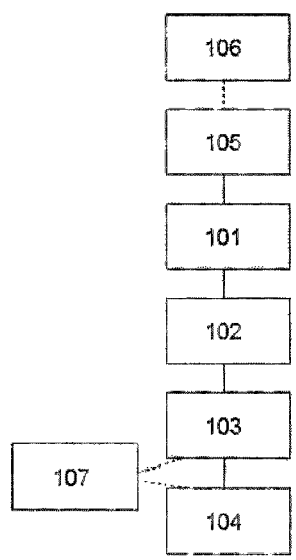
FIG. 4 represents a chart illustrating the different steps of the manufacturing method for the smart card.

FIG. 4 is a chart illustrating the steps of the making of the package 10 of the smart card 1 as represented in FIG. 1. FIGS. 5a to 5d illustrate certain steps in that making process.

Figure 5A:
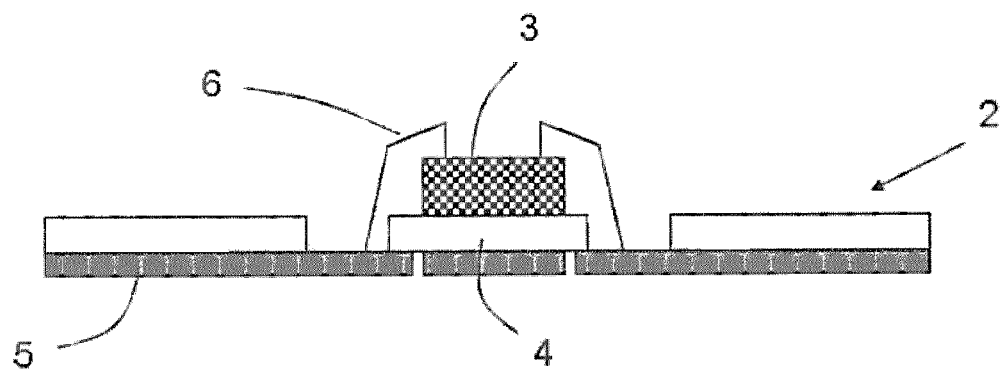
FIGS. 5a, 5b, 5c and 5d are schematic representations of the making of a package containing a smart card.
Figure 5B:
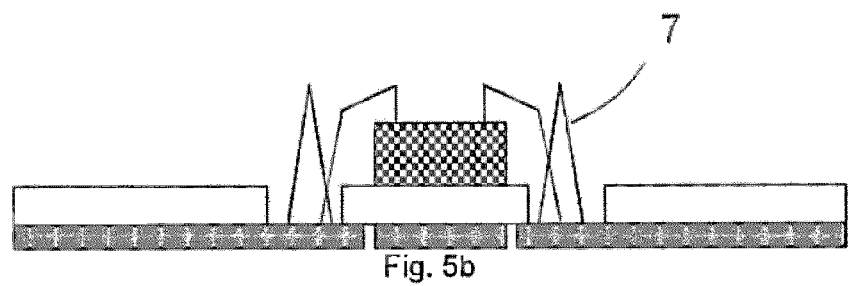
Figure 5C:
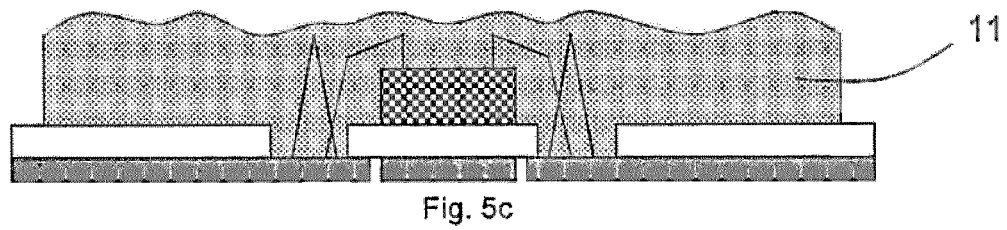

The electronic component assembly 2 as supplied is represented in FIG. 5a. The said electronic component assembly is supplied on a flexible carrier containing a plurality of assemblies of electronic components.

During an optional step 105 (FIG. 5b), the props 7 are fixed on the electrical contact zone through the openings designed to let through the connecting wires in a direction perpendicular to the plane defined by the dielectric carrier film. The props may for example be made of gold, copper, aluminium or palladium wire. The props are used to make the two exterior surfaces of the smart card (second protective coat and electrical contact zone) more parallel.

During a step 101 (FIG. 5c), a first protective coat 11 is applied to the electronic component assembly and the props 7. As mentioned above, that first protective coat 11, dispensed in the form of resin, covers the chip 3, the connecting wires 6, the props 7 and the dielectric carrier film 4. The zone covered on the dielectric carrier film 4 is greater than the final format of the smart card 1. The resin may be applied with the help of standard dispensing equipment. The dispensing of the first protective coat 11 may be optimised by using travel dispensing or a multiple-hole valve. The resin is dispensed on individual zones covering the electronic module with an area that is slightly larger, for example by a few square mm, than the smart card, which will be cut so as to retain the possible flexibility of the module carrier. At the end of this step, the said first protective coat 11 has an uneven surface.

In one alternative of the invention, the first protective coat 11 may cover several electronic modules, thus forming plates that will be cut, for example, into several integrated circuit packages, for example for a Flash memory card or another type of package with contacts on only one side.

During a step 102 (FIG. 5d), a second protective coat 12 is applied on the first protective coat 11, at least on the electronic chip 3, with a format along the plane of the carrier film that is greater than the final format of the smart card, for example by 1 mm. The second protective coat 12 is supplied in the form of individual pads. Standard pad depositing equipment can be used. The pad is deposited on the uncured resin. The said pad constitutes one outer surface of the smart card.

During the step 103, the second protective coat 12 is fixed to the first protective coat 11 by curing the first protective coat. During the said step 103, the second protective coat is placed on the props 7. Such curing may be achieved, for example, in a continuous furnace and/or a stove.

In one alternative, the second protective coat is supplied in the form of protective film that is collectively laminated onto the first protective coat 11.

Figure 5D:
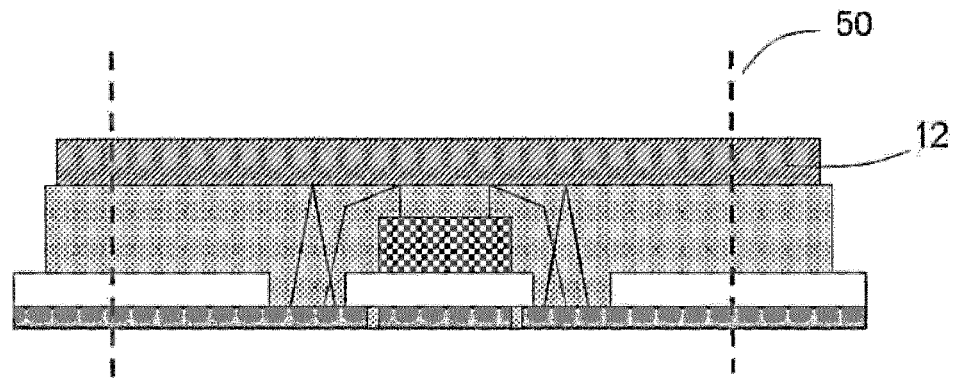

During a step 104, the smart card 1 is cut in order to obtain the final format. The cutting lines 50 are represented in FIG. 5d. The cutting technology that may be used includes, but is not limited to, laser cutting, mechanical cutting, water jet cutting etc. Because the first and second protective coats have a format that is larger than that of the smart card 1, the cut is made through the first and second protective coats and through the flexible support.

The manufacturing method may also comprise a step 106 before the step 105 during which a second set of openings 13 is made through the dielectric carrier film, distributed over the electrical contact zone so as to uncover it in part. Additional props 14 are fixed to the electrical contact zone through the second set of openings in a direction perpendicular to the plane formed by the dielectric support film. The additional props are distributed over the entire electrical contact zone, in a number depending on the required size of the smart card.

The thickness of the smart card can be adjusted on the basis of the required final thickness. To adjust that thickness, the height of the props 7, 14 or the thickness of the second protective coat 12 can be adjusted. The carrier film can also have a hollow in the dielectric at the location of the smart card, to reduce the final thickness of the smart card.

If the thickness of the smart card is not to be reduced, the surface gained may be used to maximise the size of the components of the module. That surface gained is illustrated by the FIGS. 6a, 6b and 6c.

Figure 6A:
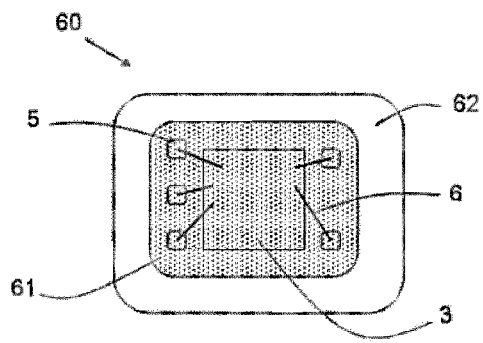
FIGS. 6a, 6b, and 6c show a useful surface of the smart card according to the prior art, and according to this invention.

FIG. 6a illustrates a bottom view of the standard module 60 designed to be embedded in a card body. The useful surface 61 of the card, that is the surface that can accommodate electronic components, is limited by the gluing surface 62 required to be able to fix the module in the card body.

Figure 6B:
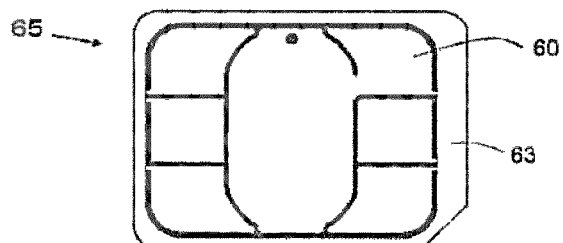

FIG. 6b represents a smart card made according to the standard embedding method 65. A bottom view of the standard module 60 can be seen, as can the body of the card 63.

Figure 6C:
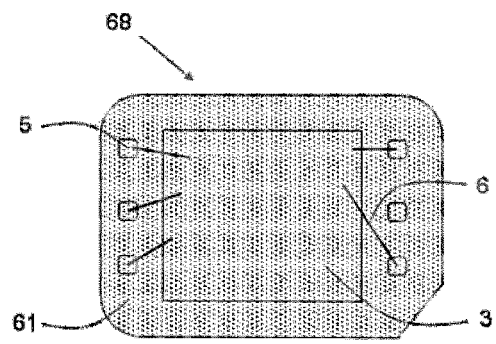

FIG. 6c illustrates the useful surface 61 of the smart card made according to this invention 68. It can be seen that unlike in the standard embedding method, the said useful surface 61 extends over the whole surface of the smart card 68. That gained surface can be used to maximise the size of the electronic components, for example the electronic chip 3.

The manufacturing method can also comprise a step 107 for the personalisation of the graphics of the second protective layer. Such personalisation is achieved after the step 103, when the second protective coat has been deposited on the first protective coat and before the cutting step 104. Graphics personalisation may be achieved by laser or inkjet. In an alternative, a label may be glued to the pads forming the second protective coat 12. In another alternative, the pads may be decorated collectively in a roll before they are cut and deposited on the first protective coat 11.

This method is particularly suitable for manufacturing 3FF and 4FF smart cards as it makes it possible to make an electronic package with a smaller format. This method can be implemented using the conventional equipment of the smart card industry. This method may also be used to make integrated circuit packages with a form factor close to that of a card, for a lower cost. Besides, this method makes it possible to manufacture smart cards directly in their final format.

The invention claimed is:

1. A smart card manufacturing method comprising a dielectric carrier film, with on one side, at least one electrical contact zone and, on a second side opposite to the first one, an electronic element assembly comprising at least one electronic chip and connecting wires, the electronic chip being connected to the said at least one electrical contact zone by the connecting wires going through a first set of openings in the dielectric carrier film, the method comprises the following steps:
   on the second side of the dielectric carrier film, props of metal wires are fixed on the electrical contact zone in a direction perpendicular to the plane defined by the dielectric carrier film and having a height that is greater than or at least equal to the height of the connecting wires before a protective resin is applied to form a first protective coat with thickness that is at least equal to the maximum extension of said props in a direction perpendicular to the plane defined by the said dielectric carrier film, with an area along the plane of the dielectric carrier film that is greater than the required format of the smart card,
   on the first protective coat, a second protective coat is applied at least on the electronic chip, with an area along the plane of the dielectric carrier film that is greater than the required format of the smart card, said second protective coat being placed on said props,
   the second protective coat is fixed to the first protective coat by curing the first protective coat,
   the assembly obtained in that way is cut to the required format.

2. A manufacturing method according to claim 1, wherein the second protective coat is made in the form of an individual pad with a format that is slightly greater than the final format of the smart card.

3. A manufacturing method according to claim 1, wherein the second protective coat is made in the form of a film extending over the whole carrier comprising a plurality of electronic modules.

4. A manufacturing method according to claim 1, wherein before the first protective coat is applied, props of the same size are fixed on the electrical contact zone through the first set of openings in the dielectric carrier film in a direction perpendicular to the plane defined by the dielectric carrier film.

5. A manufacturing method according to claim 4, wherein the first protective coat is applied in a thickness at least equal to the maximum extension of the props in the direction perpendicular to the plane defined by the dielectric carrier film.

6. A manufacturing method according to claim 1, wherein the second protective coat is made of epoxy glass or plastic or thermostable material.

7. A manufacturing method according to claim 1, wherein the graphics on the second protective coat are personalised before the coat is deposited on the first protective coat.

8. A smart card comprising a dielectric carrier film, with on one side, at least one electrical contact zone and, on a second side opposite to the first one, a useful surface on which is placed an electronic element assembly comprising:
- at least one electronic chip and connecting wires, the electronic chip being connected to the said at least one electrical contact zone by the connecting wires going through a first set of openings in the dielectric carrier film that further comprises:
- props of metal wires fixed on the electrical contact zone through the openings in a direction perpendicular to the plane defined by the dielectric carrier film and having a height that is greater than or at least equal to the height of the connecting wires,
- a first protective coat on the second side of the dielectric carrier film, with thickness at least equal to the maximum height of the maximum height of said props,
- a second protective coat on the first protective coat placed on said props,
- the useful surface extends over the whole surface of the smart card.

9. A smart card according to claim 8, further comprising said props being distributed over the entire electrical zone, in a number depending on the required size of the smart card.

\* \* \* \* \*